United States Patent
Clore et al.

(10) Patent No.: US 9,638,581 B2
(45) Date of Patent: May 2, 2017

(54) DETERMINING THERMAL PROFILES OF SEMICONDUCTOR STRUCTURES

(71) Applicant: GLOBALFOUNDRIES INC., Grand Cayman (KY)

(72) Inventors: Nicholas G. Clore, Essex Junction, VT (US); Kendra A. Lyons, Westminster, CO (US); Andrew H. Norfleet, Essex Junction, VT (US); Jared P. Yanofsky, Somerville, MA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 267 days.

(21) Appl. No.: 14/302,934

(22) Filed: Jun. 12, 2014

(65) Prior Publication Data
US 2015/0362373 A1    Dec. 17, 2015

(51) Int. Cl.
*G01R 31/26*    (2014.01)
*H01L 21/66*    (2006.01)
(Continued)

(52) U.S. Cl.
CPC .......... *G01J 5/0878* (2013.01); *G01J 5/0007* (2013.01); *G01J 5/025* (2013.01);
(Continued)

(58) Field of Classification Search
CPC .......... H01L 22/12; H01L 22/20; H01L 22/34
See application file for complete search history.

(56) References Cited

U.S. PATENT DOCUMENTS

| 4,652,143 A | 3/1987 | Wickersheim et al. |
| 4,776,827 A | 10/1988 | Greaves |

(Continued)

FOREIGN PATENT DOCUMENTS

WO    2011127593 A1    10/2011

OTHER PUBLICATIONS

Chavan, et al., "Comparison of Facet Temperature and Degradation of Unpumped and Passivated Facets of Al-Free 940-nm Lasers Using Photoluminescence", IEEE Journal of Quantum Electronics, vol. 41, No. 5, May 2005, Copyright 2005 IEEE, p. 630-635.
(Continued)

*Primary Examiner* — Zandra Smith
*Assistant Examiner* — John M Parker
(74) *Attorney, Agent, or Firm* — Thompson Hine LLP; Anthony Canale

(57) ABSTRACT

According to embodiments of the present invention, a semiconductor substrate is formed on at least a portion of a surface of a semiconductor substrate. The emitting layer is excited for a first predetermined time period. A first luminescent intensity value of the emitting layer is determined. In response to exposing the semiconductor substrate and the emitting layer to a condition for a second predetermined time period, a second luminescent intensity value of the emitting layer is determined. A thermal profile of at least the portion of the surface of the semiconductor substrate is determined utilizing the first luminescent intensity value and the second luminescent intensity value of the emitting layer. The thermal profile at least reflects information about one or more of the condition and the semiconductor substrate subsequent to exposure to the condition.

5 Claims, 4 Drawing Sheets

(51) Int. Cl.
  *G01J 5/08* (2006.01)
  *G01J 5/02* (2006.01)
  *G01J 5/00* (2006.01)
  *G01J 5/28* (2006.01)

(52) U.S. Cl.
  CPC . *G01J 2005/0085* (2013.01); *G01J 2005/283* (2013.01); *H01L 22/12* (2013.01); *H01L 22/20* (2013.01); *H01L 22/34* (2013.01)

(56) References Cited

U.S. PATENT DOCUMENTS

| | | | |
|---|---|---|---|
| 4,997,286 A | 3/1991 | Fehrenbach et al. | |
| 5,602,932 A | 2/1997 | Macdonald et al. | |
| 6,652,138 B2 | 11/2003 | Clyne | |
| 8,046,188 B2 | 10/2011 | Kinugasa et al. | |
| 8,907,991 B2* | 12/2014 | Jaffari | G06F 17/5018 345/204 |
| 2002/0167987 A1* | 11/2002 | Schlagheck | G01N 25/72 374/5 |
| 2011/0313407 A1* | 12/2011 | Rafailov | A61N 5/062 606/2 |
| 2013/0092964 A1* | 4/2013 | Li | C09K 11/025 257/98 |
| 2015/0238967 A1* | 8/2015 | Erickson | B01L 7/52 435/6.12 |

OTHER PUBLICATIONS

Fritz, et al., "Extraction of bonding strain data in diode lasers from polarization-resolved photoluminescence measurements", Microelectronics Reliability 44 (2004), Copyright 2003 Elsevier Ltd., p. 787-796.

Weon, et al., "A unified decay formula for luminescence decays", Journal of Applied Physics 98, 096101 (2005), Copyright 2005 American Institute of Physics.

* cited by examiner

DETERMINING THERMAL PROFILES OF SEMICONDUCTOR STRUCTURES

BACKGROUND

The present invention relates generally to the field of semiconductor structure fabrication methods, and specifically to determining the thermal profiles of semiconductor structures.

Reflow soldering is a process in which a plated metallurgy may be used to temporarily attach one or several electrical components to their contact pads, after which, the entire assembly is subjected to controlled heat, which melts the solder, permanently connecting the joint. Heating may be accomplished by passing the assembly through a reflow oven, or under an infrared lamp, or by soldering individual joints with a hot air pencil. The goal of the reflow process is to melt the solder and heat the adjoining surfaces without overheating and damaging the electrical components that are included therein.

SUMMARY

According to embodiments of the present invention, a semiconductor substrate is formed on at least a portion of a surface of a semiconductor substrate. The emitting layer is excited for a first predetermined time period. A first luminescent intensity value of the emitting layer is determined. In response to exposing the semiconductor substrate and the emitting layer to a condition for a second predetermined time period, a second luminescent intensity value of the emitting layer is determined. A thermal profile of at least the portion of the surface of the semiconductor substrate is determined utilizing the first luminescent intensity value and the second luminescent intensity value of the emitting layer. The thermal profile at least reflects information about one or more of the condition and the semiconductor substrate subsequent to exposure to the condition.

DETAILED DESCRIPTION

Figure 1:
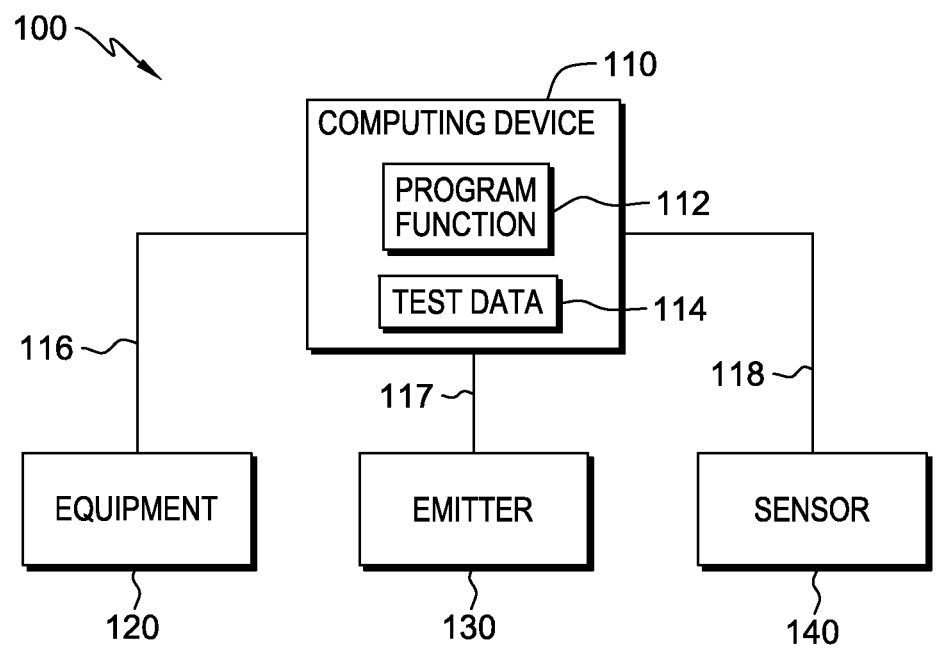
FIG. 1 is a functional block diagram illustrating an environment, in accordance with an embodiment of the present invention.

With reference now to FIGS. 1-4, the descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device, such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Java™ Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reflow soldering is a process in which a plated metallurgy can be used to temporarily attach one or more electrical components to their contact pads, after which the entire assembly is subjected to controlled heat, which melts the solder, permanently connecting the joint. Heating may be accomplished by passing the assembly through a reflow oven, or under an infrared lamp, or by soldering individual joints with a hot air pencil. The goal of the reflow process is to melt the solder and heat the adjoining surfaces without overheating and damaging the electrical components. During reflow, controlled collapse chip connections (C4) packages can exhibit non-uniform thermal profiles, which can result in, for example, thermal stress or a difference in microstructures.

Embodiments of the present invention seek to provide a method, product, and system to determine the thermal profile of semiconductors. Sequential steps of an exemplary embodiment of a method, product, and system for determining thermal profiles of a semiconductor structures are described below with respect to the schematic illustrations of FIGS. 1-4. Similar reference numerals denote similar features.

FIG. 1 is a functional block diagram illustrating an environment, generally designated 100, in accordance with an embodiment of the present invention. Environment 100 includes equipment 120, emitter 130, sensor 140, and computing device 110. In an embodiment, equipment 120, emitter 130, sensor 140, computing device 110, or any combination thereof may be depicted as a single entity. Although not shown, environment 100 may include additional connections than depicted. In certain embodiments, environment 100 does not include emitter 130. Equipment 120 is in communication with computing device 110 via communications link 116. Equipment 120 deposits emitting material on the surface of semiconductor structures, in accordance with an embodiment of the present invention. In an embodiment, equipment 120 deposits one or layers of emitting material utilizing a slurry painting method or a conventional deposition process, such as chemical vapor deposition.

Applicable emitting material includes material capable of luminescent decay, material diffusion, ionizing radiation, temperature-based spectral shift, and temperature-dependent luminescence (discussed further below). In an embodiment, the emitting layer emits one or more of a luminescence, visible light, infrared light, and ions. In other embodiments, the emitting layer is capable of chemiluminescence, bioluminescence, and/or photoluminescence. In other embodiments, the emitting layer is comprises quantum dots capable of temperature-based spectral shifts.

In certain embodiments, the emitting layer includes a first and second diffusion layer, wherein the first diffusion layer diffuses into the second diffusion layer at a diffusion rate that is a function of time and/or temperature. Emitter 130 is in communication with computing device 110 via communications link 117. Emitter 130 is not utilized in embodiments wherein the emitting material is capable of material diffusion (discussed below). In an embodiment, photoluminescent material, such as material that includes erbium or ytterbium, is the emitting material.

In an embodiment, applicable photoluminescent material includes phosphors. For example, phosphors, such as $SrAlO_4:Eu^{2+}$, $Dy^{3+}$, are alkaline earth aluminates that are co-doped with divalent europium ($Eu^{2+}$) and trivalent dysprosium ($Dy^{3+}$) ions. Alkaline earth aluminates typically have a general formula, $MAl_2O_4$, wherein M may be barium (Ba), calcium (Ca), or strontium (Sr). Emitter 130 is a device that exudes a type of signal, such as photons or ionizing particles, and exposes emitting material to the signal. In an embodiment, emitter 130 emits photons in the 510 nm to 530 nm wavelength range.

Sensor 140 is in communication with computing device 110 via communications link 118, accordance with an embodiment of the present invention. Sensor 140 detects signals that are, for example, associated with luminescent decay, material diffusion, ionizing radiation, temperature-based spectral shift, and/or temperature-dependent luminescence. In an embodiment, sensor 140 is a photometer. Sensor 140 can measure light by counting photons or incoming flux. Photon measurements may be defined in units, such as photons/cm$^2$ or photons*cm$^{-2}$. Computing device 110 is used to determine thermal profiles of semiconductor structures, in accordance with an embodiment of the present invention. Computing device 110 includes test data 114 and program function 112. Test data 114 are emission readings generated by sensor 140 and received via communications link 118.

Program function 112 is software that determines the thermal profile of semiconductor structures, in accordance with an embodiment of the present invention. Program function 112 can send instructions to equipment 120 and emitter 130 via communications links 116 and 117, respectively. Program function 112 can, via communications link 118, receive emission readings generated by sensor 140. Program function 112 can determine the thermal profile of semiconductor structures.

Figure 2:
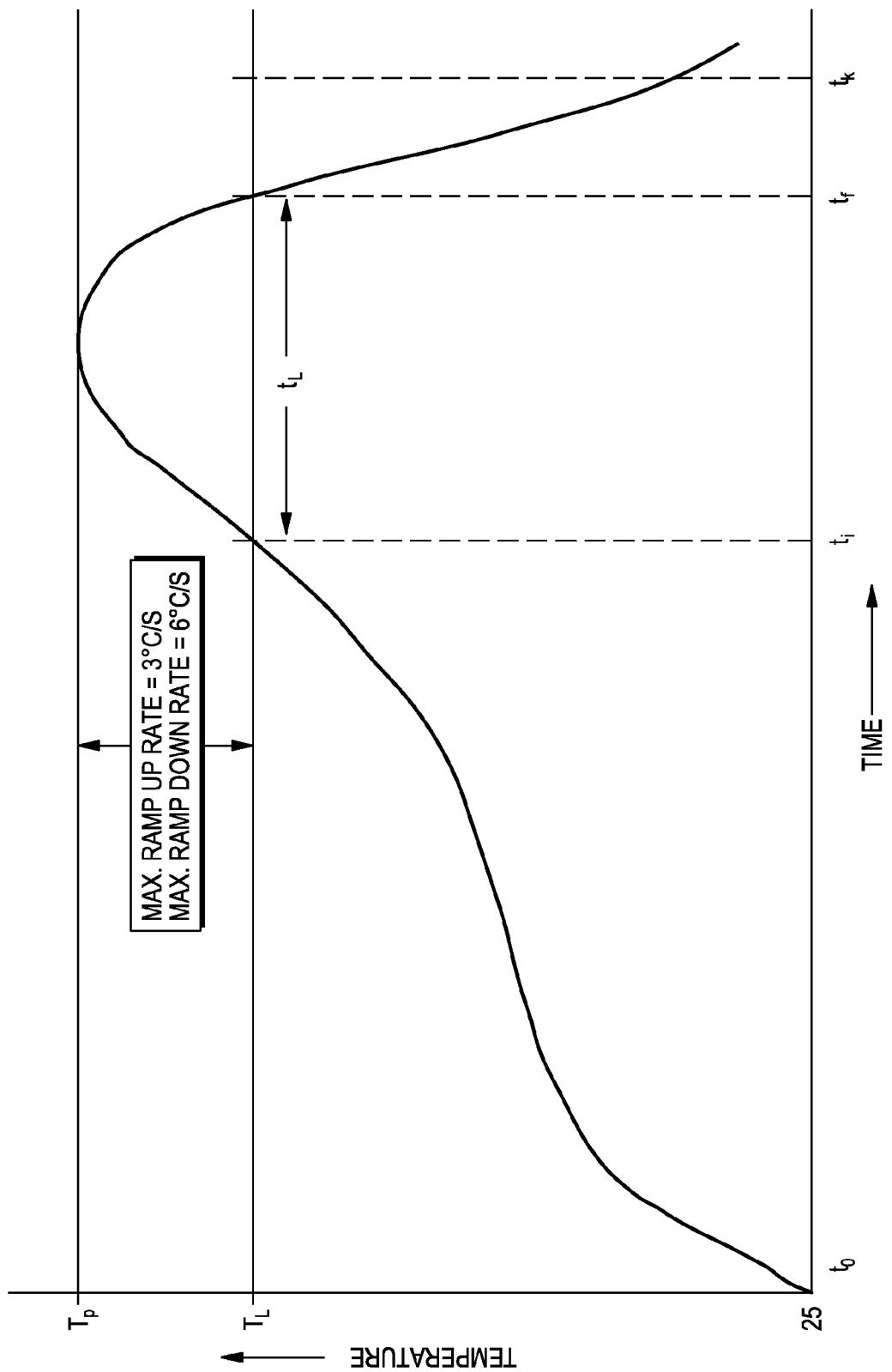
FIG. 2 is a reflow profile of a semiconductor structure, in accordance with an embodiment of the present invention.

FIG. 2 is a reflow profile of a semiconductor structure, in accordance with an embodiment of the present invention. Specifically, FIG. 2 illustrates a reflow profile of a semiconductor structure (not shown), for example, a semiconductor package comprising a first and second semiconductor structure joined by C4, wherein the first semiconductor structure comprises an emitting layer that includes, for example, an alkaline earth aluminate is formed on the backside thereof using equipment 120. The emitting material that comprises the emitting layer undergoes photoexcitation using emitter 130. In this particular example, $T_P$ is the peak temperature of the package and should not exceed the maximum operating temperature of the C4.

$T_L$ is the liquidus temperature and denotes the temperature above which the C4 is in a liquid state, and $t_L$ is the time maintained above $T_L$. In certain embodiments, program function 112 determines emission readings while the C4 is in a solid state, wherein the initial read is taken at to and the final read is taken at $t_k$. In other embodiments, program function 112 determines emission readings while the C4 is in a liquid state, wherein the initial read is taken at $t_i$ and the final read is taken at $t_f$. In certain embodiments, the reflow profile comprises a maximum ramp up rate of 3° C./s and a maximum ramp down rate of 6° C./s. Program function 112 determines the thermal profile of the semiconductor package by determining the difference between the initial and final reads.

Figure 3:
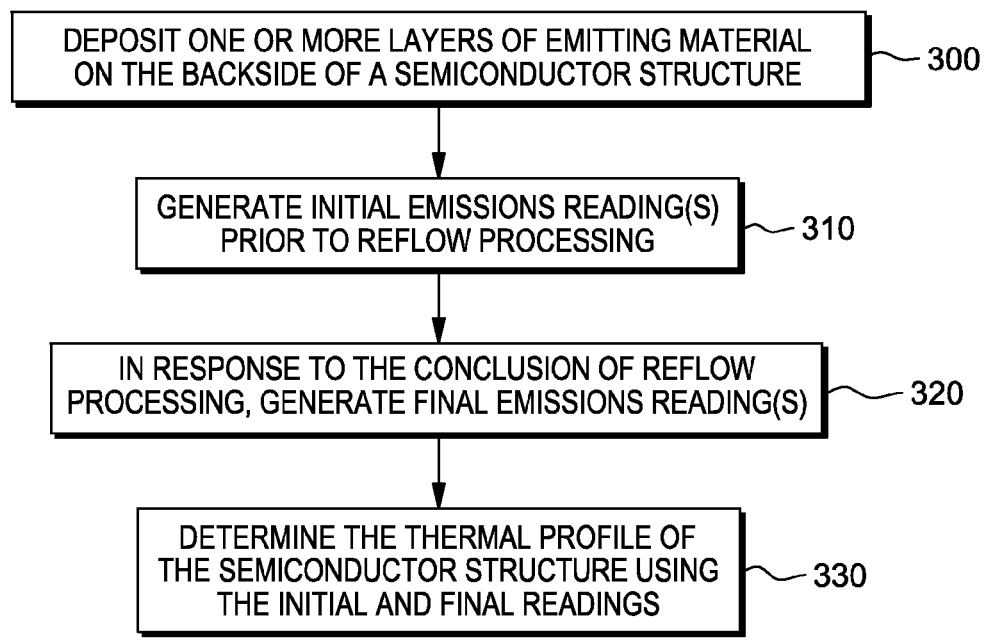
FIG. 3 is a flowchart depicting the operational steps of a program function, in accordance with an embodiment of the present invention.

In an embodiment, program function 112 determines a thermal profile that reflects regions of high and low temperature. In other embodiments, sensor 140 comprises a 2-dimensional array of sensors, such as photodiodes, that can detect ultraviolet and/or infrared wavelengths, such as wavelengths in the 300 nm to 1700 nm range. Program function 112 can generate a 2-dimensional or 3-dimensional graphic representation of the determined thermal profile. FIG. 3 is a flowchart depicting the operational steps of program function 112, in accordance with an embodiment of the present invention.

Program function 112 instructs equipment 120 to deposit one or more layers of emitting material on the backside of a semiconductor structure (step 300). For example, equipment 120 deposits a layer of an emitting material that includes an alkaline earth aluminate, for example, SrAlO$_4$: Eu, Dy. Program function 112 takes an initial emissions reading using sensor 140 (step 310). For example, program function 112 instructs emitter 130 to excite the emitting material for a predetermined time period. Subsequently, program function 112 takes an initial emissions reading of two adjacent regions of the emitting material, regions A and B, for example, 75 photons/cm$^2$ and 75 photons/cm$^2$, respectively.

At the end of the reflow process, program function 112 takes a final emissions reading using sensor 140 (step 320). At the end of the reflow process, program function 112 takes a final emissions reading for regions A and B using sensor 140, 52 photons/cm$^2$ and 35 photons/cm$^2$, respectively. Program function 112 determines the thermal profile of the semiconductor package using the initial and final readings (step 330). For example, region B has a lower photon count compared to region A, which is reflective that region B retained more heat, which may be reflective of reflow issues. Such regional photon count comparisons can assist one in, for example, determining whether the chip was sufficiently heated to form proper interconnects, quantitating thermal load, and/or ascertaining the thermal uniformity across a substrate.

Additional reflow issues may be addressed using photon count comparisons. For example, during reflow of C4s, a difference in the thermal profiles of modules can result in thermal stress or a difference in the microstructures included therein. Regional comparisons of photon counts can assist one in ascertaining the uniformity of the local thermal budget across each module. Multiple reflows of wafers and dies may affect EM performance. Here, regional photon count comparisons can assist one in ascertaining a die's thermal history through manufacturing.

Figure 4:
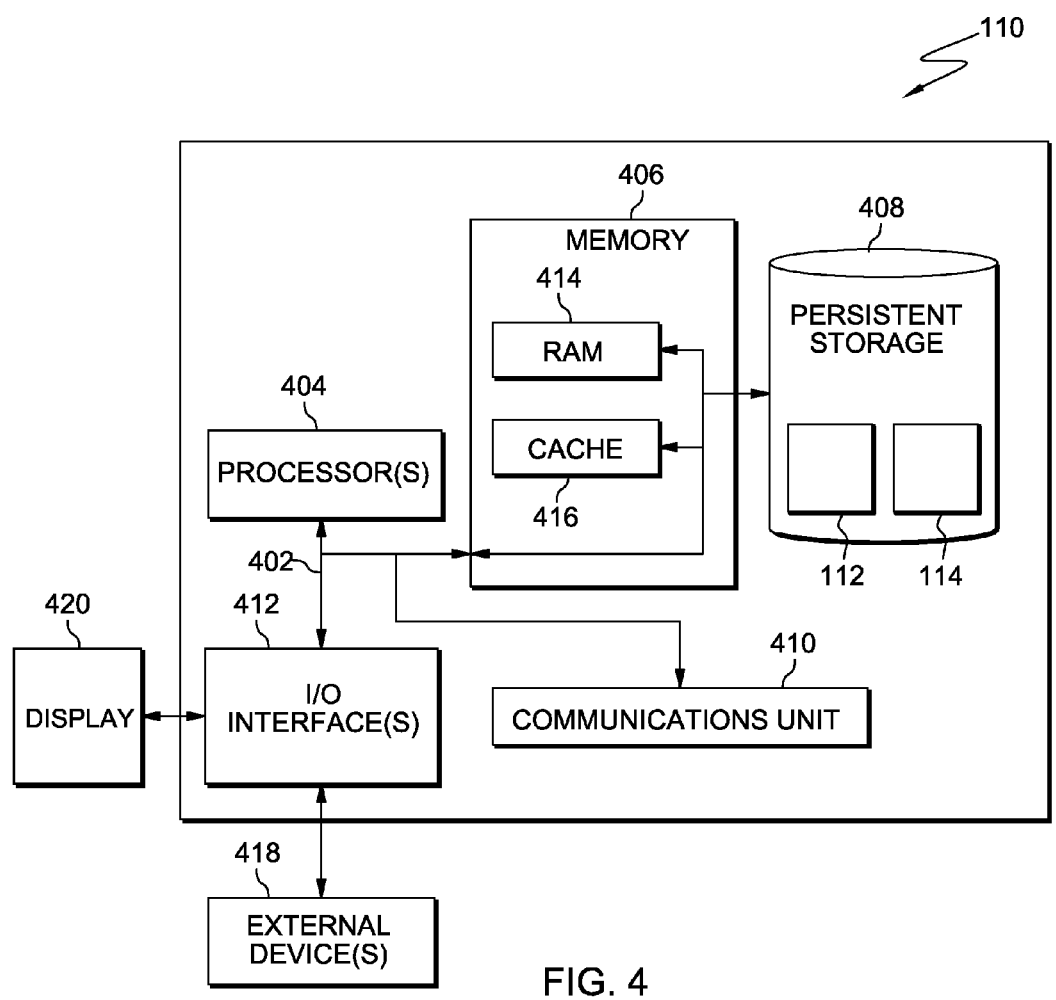
FIG. 4 depicts a block diagram of components of the computing device executing the program function, in accordance with an embodiment of the present invention.

FIG. 4 shows a block diagram of an exemplary design flow 400 used, for example, in semiconductor IC logic design, simulation, test, layout, and manufacture. Design flow 400 includes processes, machines, and/or mechanisms for processing design structures or devices to generate logically or otherwise functionally equivalent representations of the design structures and/or devices described above and shown in FIGS. 1-3. The design structures processed and/or generated by design flow 400 may be encoded on machine-readable transmission or storage media to include data and/or instructions that, when executed or otherwise processed on a data processing system, generate a logically, structurally, mechanically, or otherwise functionally equivalent representation of hardware components, circuits, devices, or systems.

Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array). Design flow 400 may vary depending on the type of representation being designed. For example, a design flow 400 for building an application specific IC (ASIC) may differ from a design flow 400 for designing a standard component, or from a design flow 400 for instantiating the design into a programmable array, for example, a programmable gate array (PGA) or a field programmable gate array (FPGA) offered by Altera® Inc. or Xilinx® Inc.

FIG. 4 depicts a block diagram of components of server computing device 110 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

A non-transitory computer readable storage medium embodiment herein is readable by a computerized device. The non-transitory computer readable storage medium stores instructions executable by the computerized device to perform a method that tests integrated circuit devices to measure a voltage overshoot condition.

Server 110 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer readable storage media. In this embodiment, memory 406 includes random access memory (RAM) 414 and cache memory 416. In general, memory 406 can include any suitable volatile or non-volatile computer readable storage media.

Program function 112 and test data 114 are stored in persistent storage 408 for execution and/or access by one or more of the respective computer processor(s) 404 via one or more memories of memory 406. In this embodiment, persistent storage 408 includes a magnetic hard disk drive. Alternatively, or in addition to a magnetic hard disk drive, persistent storage 408 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. Program function 112 may be downloaded to persistent storage 408 through communications unit 410.

I/O interface(s) 412 allows for input and output of data with other devices that may be connected to server 110. For example, I/O interface(s) 412 may provide a connection to external device(s) 418 such as a keyboard, a keypad, a touch screen, and/or some other suitable input device. External device(s) 418 can also include portable computer readable storage media such as, for example, thumb drives, portable optical or magnetic disks, and memory cards. Software and data used to practice embodiments of the present invention, e.g., program function 112 and test data 114, can be stored on such portable computer readable storage media and can be loaded onto persistent storage 408 via I/O interface(s) 412. I/O interface(s) 412 also connects to a display 420. Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience and, thus, the invention should not be limited to use solely in any specific application identified and/or implied by such nomenclature.

What is claimed is:

1. A method using an emitting layer on at a surface of a semiconductor structure, the method comprising:
    performing a reflow process that heats the semiconductor structure according to a temperature profile to cause a controlled collapse chip connection to transform from a solid state to a liquid state;
    during the reflow process, sensing, by one or more computer processors, emission from the emitting layer for a first predetermined time period;
    determining, by one or more computer processors, a first luminescent intensity value of the emitting layer over the first predetermined time period;
    during the reflow process, sensing, by one or more computer processors, emission from the emitting layer for a second predetermined time period;
    determining, by one or more computer processors, a second luminescent intensity value of the emitting layer over a second predetermined time; and
    determining, by one or more computer processors, a thermal profile of the surface of the semiconductor structure utilizing the first luminescent intensity value of the emitting layer and the second luminescent intensity value of the emitting layer.

2. The method of claim 1, wherein the emitting layer emits one or more of luminescence, visible light, infrared light, and ions.

3. The method of claim 1, wherein the emitting layer is capable of one or more of chemiluminescence, bioluminescence, and photoluminescence.

4. The method of claim 1, wherein the emitting layer includes a quantum dot capable of a temperature-based spectral shift.

5. The method of claim 1, wherein the emitting layer includes an alkaline earth aluminate.

* * * * *